United States Patent
Fallin et al.

(10) Patent No.: US 10,796,977 B2
(45) Date of Patent: Oct. 6, 2020

(54) METHOD AND APPARATUS TO CONTROL TEMPERATURE OF A SEMICONDUCTOR DIE IN A COMPUTER SYSTEM

(71) Applicant: Intel Corporation, Santa Clara, CA (US)

(72) Inventors: John Fallin, Beaverton, OR (US); Daniel J. Ragland, Sherwood, OR (US); Jonathan P. Douglas, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/292,218

(22) Filed: Mar. 4, 2019

(65) Prior Publication Data
US 2020/0286804 A1  Sep. 10, 2020

(51) Int. Cl.

| | |
|---|---|
| *H05K 7/00* | (2006.01) |
| *H05K 7/20* | (2006.01) |
| *H01L 23/34* | (2006.01) |
| *H01L 23/367* | (2006.01) |
| *H01L 23/467* | (2006.01) |
| *H01L 23/473* | (2006.01) |
| *G06F 1/20* | (2006.01) |
| *G06F 1/26* | (2006.01) |
| *G06F 17/50* | (2006.01) |
| *G11C 5/00* | (2006.01) |
| *G11C 29/50* | (2006.01) |
| *G06F 11/14* | (2006.01) |

(52) U.S. Cl.
CPC .......... *H01L 23/345* (2013.01); *G06F 1/206* (2013.01); *G06F 11/1417* (2013.01); *H01L 23/473* (2013.01); *G06F 2200/201* (2013.01)

(58) Field of Classification Search
CPC ... H05K 7/00; H05K 7/20; H05K 7/22; H01L 23/34; H01L 23/367; H01L 23/467; H01L 23/473; G06F 1/20; G06F 1/26; G06F 1/206; G06F 17/50; G11C 5/00; G11C 29/50; G11C 29/64
USPC ..... 361/679.46, 679.54, 689, 695, 716, 760; 219/497; 340/3.1; 399/33, 70; 713/2, 713/300; 716/100
See application file for complete search history.

(56) References Cited

U.S. PATENT DOCUMENTS

| | | | | |
|---|---|---|---|---|
| 3,711,359 A | * | 1/1973 | Lawhead | ............... B41F 19/068 156/359 |
| 4,316,663 A | * | 2/1982 | Fischer | ................ G03D 15/022 219/485 |

(Continued)

FOREIGN PATENT DOCUMENTS

JP          5800519 B2      10/2015

OTHER PUBLICATIONS

Berktold, "CPU Monitoring With DTS/PECI", Sep. 2010, 23 pages.
International Search Report and Written Opinion for PCT Patent Application No. PCT/US20/13361, dated May 8, 2020, 12 pages.

*Primary Examiner* — Xiaoliang Chen
(74) *Attorney, Agent, or Firm* — Compass IP Law, PC

(57) ABSTRACT

Circuitry to apply heat to a die while the die junction temperature is below a minimum die junction temperature of an operating die junction temperature range for the die is provided. The circuitry to avoid a system boot failure when the die junction temperature is below the operating die junction temperature range of the die.

7 Claims, 7 Drawing Sheets

(56) References Cited

U.S. PATENT DOCUMENTS

| | | | | |
|---|---|---|---|---|
| 6,098,279 | A * | 8/2000 | Lee | H01L 21/4882 165/185 |
| 6,329,642 | B1 * | 12/2001 | Kaneko | G11C 29/028 219/492 |
| 6,396,706 | B1 * | 5/2002 | Wohlfarth | H05K 1/0212 219/388 |
| 6,466,441 | B1 * | 10/2002 | Suzuki | H05K 7/20154 165/104.33 |
| 8,358,085 | B2 * | 1/2013 | Catalano | G01K 7/01 315/297 |
| 8,886,064 | B2 * | 11/2014 | Fujimoto | G03G 15/205 399/33 |
| 8,937,807 | B2 * | 1/2015 | Baquiano | H05K 7/20536 174/252 |
| 9,235,022 | B2 * | 1/2016 | Cameron | H05K 7/20427 |
| 9,432,033 | B2 * | 8/2016 | Dastidar | H03L 7/16 |
| 10,222,843 | B1 * | 3/2019 | Lin | H05K 7/20209 |
| 2003/0170515 | A1 * | 9/2003 | Wang | H01M 8/04007 429/416 |
| 2006/0052970 | A1 * | 3/2006 | Arabi | G06F 1/206 702/132 |
| 2007/0226660 | A1 * | 9/2007 | Ogawa | G06F 30/39 716/100 |
| 2008/0145297 | A1 * | 6/2008 | Johannes | B01F 3/04 423/418.2 |
| 2008/0302505 | A1 * | 12/2008 | Kato | F25B 23/006 165/61 |
| 2008/0303547 | A1 | 12/2008 | Balasubramanian et al. | |
| 2009/0014433 | A1 * | 1/2009 | O'Neil | G06F 1/206 219/491 |
| 2009/0016408 | A1 | 1/2009 | Doan et al. | |
| 2009/0120618 | A1 * | 5/2009 | Konig | F01K 15/00 165/104.21 |
| 2011/0243167 | A1 | 10/2011 | Castillo et al. | |
| 2011/0296155 | A1 * | 12/2011 | Belady | G06F 1/206 713/2 |
| 2012/0050000 | A1 * | 3/2012 | Melvin, Jr. | G05B 9/02 340/3.1 |
| 2012/0228392 | A1 * | 9/2012 | Cameron | G02B 7/008 236/34 |
| 2013/0000871 | A1 * | 1/2013 | Olson | G05D 23/01 165/104.26 |
| 2013/0128452 | A1 * | 5/2013 | Baquiano | H05K 7/20536 361/679.54 |
| 2013/0138935 | A1 * | 5/2013 | Belady | G06F 1/206 713/1 |
| 2013/0158737 | A1 * | 6/2013 | O'Neil | G06F 1/206 700/299 |
| 2013/0195676 | A1 * | 8/2013 | Luo | H05K 7/20209 417/44.1 |
| 2014/0183957 | A1 * | 7/2014 | Duchesneau | F01K 13/006 307/64 |
| 2015/0062824 | A1 * | 3/2015 | Hyun | H01L 23/34 361/716 |
| 2015/0234144 | A1 * | 8/2015 | Cameron | G02B 7/008 236/1 F |
| 2016/0216749 | A1 | 7/2016 | Vyshetsky | |
| 2017/0059187 | A1 * | 3/2017 | Smith, Jr. | F24D 19/109 |
| 2017/0131663 | A1 * | 5/2017 | Kikegawa | G03G 15/1675 |
| 2018/0054923 | A1 * | 2/2018 | Bryan | H05K 13/04 |
| 2019/0229495 | A1 * | 7/2019 | Pierer | H01S 5/4012 |

* cited by examiner

METHOD AND APPARATUS TO CONTROL TEMPERATURE OF A SEMICONDUCTOR DIE IN A COMPUTER SYSTEM

FIELD

This disclosure relates to temperature of a semiconductor die and in particular to provide supplemental heat to a semiconductor die in a system.

BACKGROUND

A semiconductor die (also referred to as a "chip" or "integrated circuit") is a single piece of a semiconductor wafer that includes an integrated circuit. Dies such as central processing units (CPUs), chipsets and graphics processing units (GPUs) are susceptible to temporary malfunction or permanent failure if overheated. A semiconductor die that is operated at higher clock frequencies and voltages increases power consumption and heat. Cooling methods (for example, water cooling or liquid nitrogen) may be used to remove waste heat produced by a semiconductor die.

BRIEF DESCRIPTION OF THE DRAWINGS

Features of embodiments of the claimed subject matter will become apparent as the following detailed description proceeds, and upon reference to the drawings, in which like numerals depict like parts, and in which:

Figure 1:
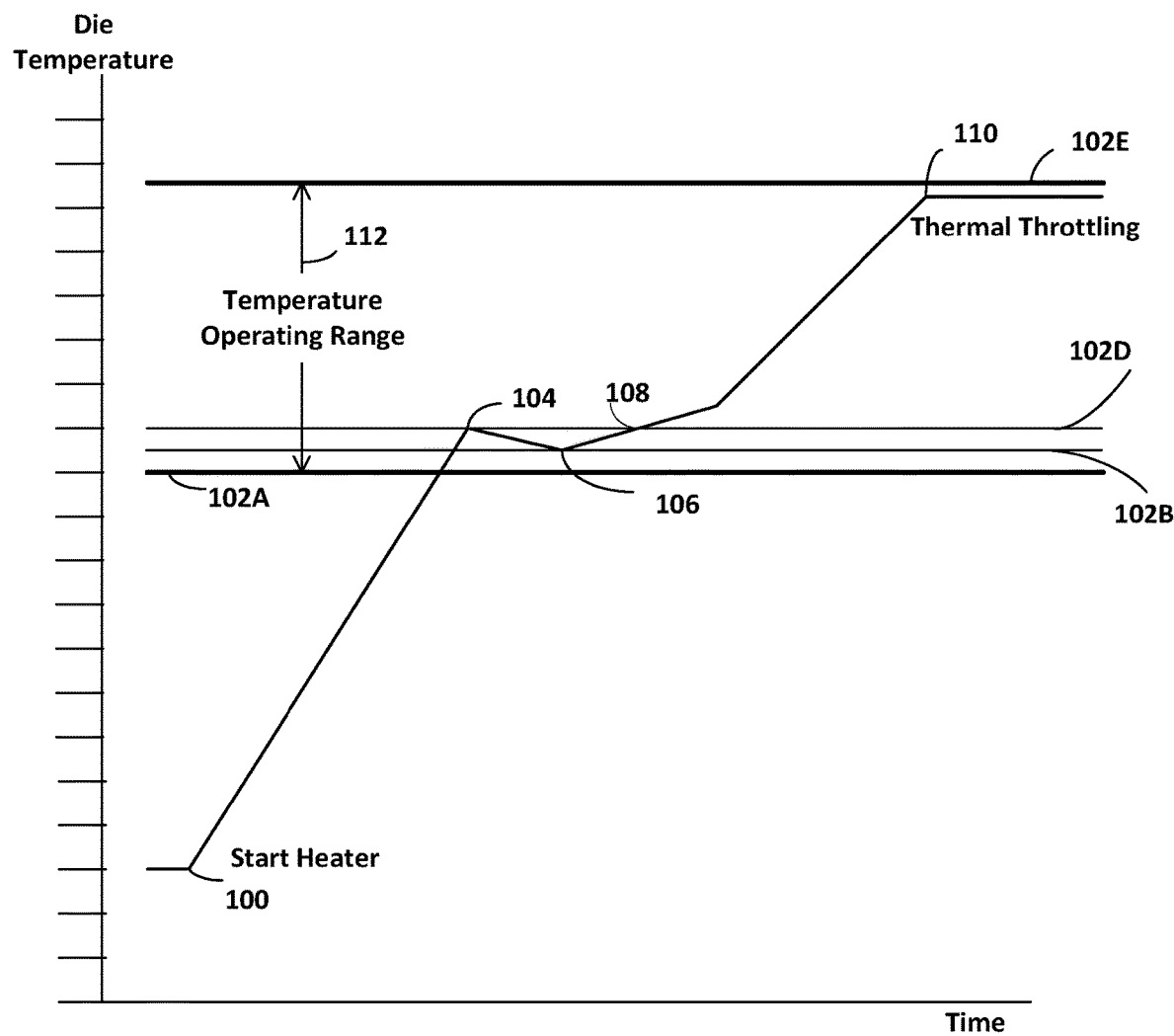
FIG. 1 is a graph illustrating junction temperature in a die in a system from system pre-boot, through system boot and during system runtime.

Although the following Detailed Description will proceed with reference being made to illustrative embodiments of the claimed subject matter, many alternatives, modifications, and variations thereof will be apparent to those skilled in the art. Accordingly, it is intended that the claimed subject matter be viewed broadly, and be defined as set forth in the accompanying claims.

DESCRIPTION OF EMBODIMENTS

Dies are also susceptible to failure when operating at a temperature that is below a validated temperature range. A die is typically validated to operate within a temperature range, for example, between −40° C. and 100° C. An extreme low temperature below the validated temperature range can occur naturally for example, for dies used in automotive, telecom and sensing systems that are used in extreme cold temperature environments.

An extreme low temperature below the validated temperature range also occurs when the die (for example, a Central Processing Unit (CPU)) die is cooled through the use of liquid Nitrogen (LN2) or liquid helium. The die can be cooled so that the die can be operated at a higher clock frequency than certified by the manufacturer of the die (also referred to as overclocking) for central processing unit dies in computers used in enthusiast computing for example, for gaming applications. Operating voltage of the die can also be increased to maintain the die's operational stability at the higher clock frequency.

Junction temperature (also referred to as transistor junction temperature) is the operating temperature of the semiconductor in a die. When the central processing unit die is running in an overclocked mode and under a workload, the liquid nitrogen keeps a junction temperature in the central processing unit die within a maximum specified die junction temperature.

The boiling point of liquid nitrogen is −195.79° C. and the boiling point of helium is about −269° C. at one atmosphere. Liquid nitrogen and liquid helium boil immediately on contact with a warmer object. If the liquid nitrogen is not applied before system boot, the central processing unit die would quickly heat above the operating temperature range and the central processing unit die would shut down before liquid nitrogen is manually added to a cooling reservoir on a central processing unit die heatsink.

After the liquid nitrogen or liquid helium is applied to a die, but before the system boot process starts, the die temperature in the integrated circuit may fall below the minimum junction temperature in the die which can result in a failure during and after the system boot process. Failures in a central processing unit die have been observed at sub 0° C. temperatures, for example, cold bug (CB) (when the system is functional) at about −140° C. and cold boot bug (CBB) (during the system boot processes) at about −80° C. resulting in a central processing unit die not reaching its full overclocking potential under liquid nitrogen or liquid helium type cooling. The cold bug occurs when a very low temperature cooling such as liquid nitrogen is used.

To avoid a failure when operating at a temperature that is below an operating temperature range of the die, circuitry (for example, a controlled feedback circuit) is used to heat the die until the die junction temperature is within an operating temperature range.

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

FIG. 1 is a graph illustrating an example of junction temperature in a die in a system from system pre-boot, through system boot and during system runtime. The operating temperature range 112 is between a minimum operating temperature 102A and a maximum operating temperature 102E. At time 100, the junction temperature in the die is below the minimum operating temperature 102A the operating temperature range 112. Heat is applied by a circuit to the die until at time 104, the junction temperature passes a "heat off" threshold temperature 102B, the die heater is turned off and the system boot process starts. If sufficient power is not generated during the initial stage of the system boot process, the die junction temperature may start to fall as the liquid nitrogen or liquid helium is still present. If the die junction temperature again falls below a lower "heat-on" threshold 102B, which is set to keep some margin above the minimum operating temperature 102A, the heater is turned back on. In this example this occurs at time 106. After the die junction temperature is again above the "heat-off" threshold 102D at time 108, the heater is turned off again. As the system boot process progresses, the die can generate sufficient power to keep the die junction temperature above the "heat-on" threshold temperature 102B.

After the system boot process is complete, during runtime die junction temperature continues to be monitored (for example, by thermostat mechanism that controls the heater). If the die junction temperature gets too high at time 110 such that the maximum operating temperature 102E would be violated, thermal throttling occurs, for example, lowering clock rates. If the die junction temperature falls to the "heat-on" threshold 102B, the heater can be turned on and turned off again when the die junction temperature reaches the "heat off" threshold 102D.

After the junction temperature of the die is within the operating temperature range 112, heat is generated by the operation of the die. The circuit can continue to monitor the junction temperature in the die and provide heat to the die in addition to the heat generated by the operation of the die, if the junction temperature in the die drops below the minimum operating temperature 102A.

Figure 2:
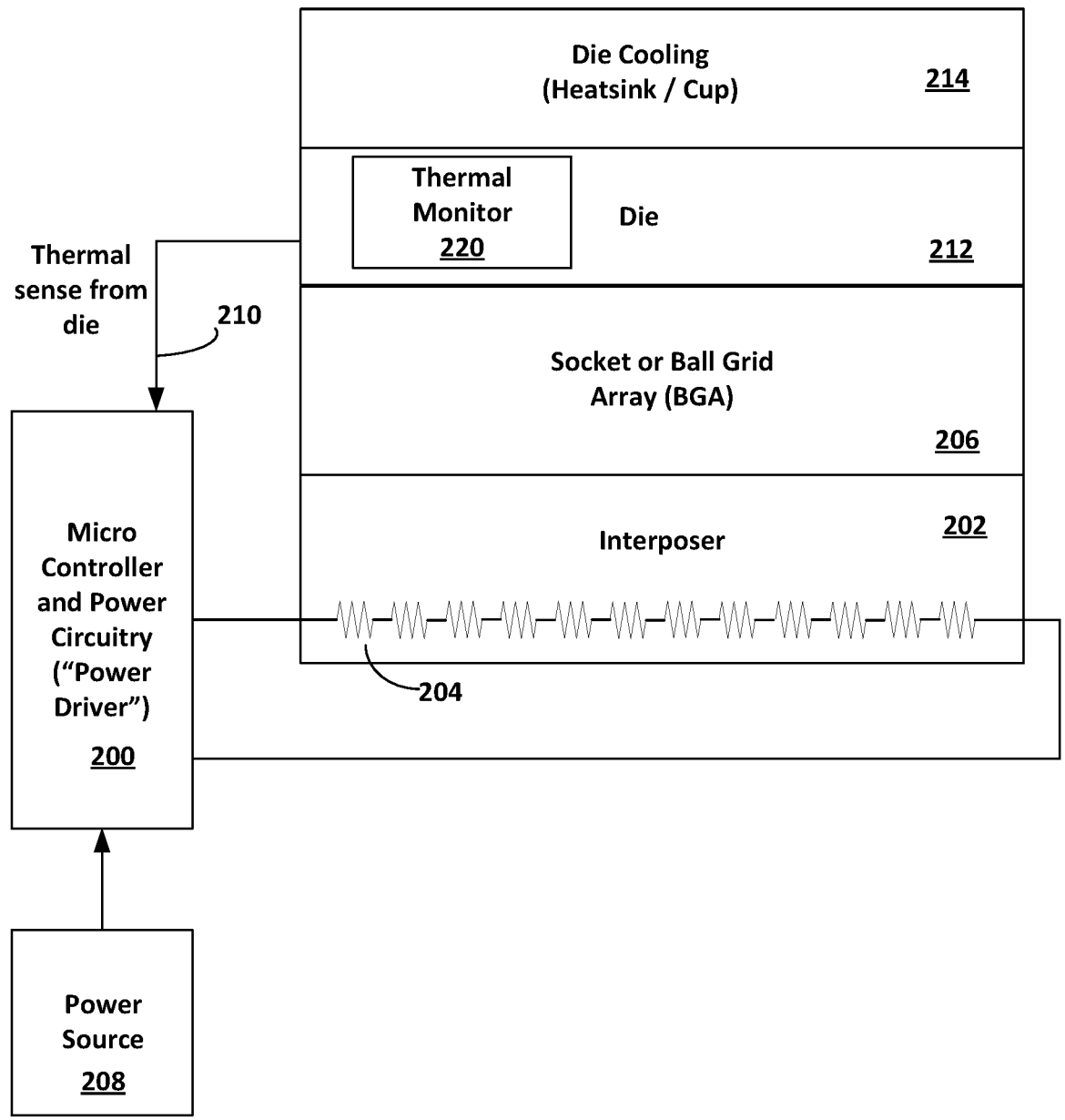
FIG. 2 is a block diagram of an embodiment of circuitry to apply and control heat to a die.

FIG. 2 is a block diagram of an embodiment of circuitry to apply and control heat to a central processing unit die 212. The bottom of the central processing unit die 212 is coupled to a Socket or Ball Grid Array (BGA) 206. A Die Cooling Heatsink/Cup 214 that may also be referred to as a bulk cooling reservoir is on top of the central processing unit die 212 to allow the liquid nitrogen or liquid helium to be applied.

The circuitry includes a microcontroller and power circuitry 200 and an interposer 202. The power circuitry may also be referred to as a "power driver". The interposer 202 includes a resistive heating element 204 that is controlled by the microcontroller and power circuitry 200. The resistive heating element 204 is an on package resistor that creates power loss ($P=I^2R$; Power (P), Current (I), Resistance (R)) to provide supplemental die heat. In an embodiment, the die 212 is a Central Processor Unit (CPU) die ("processor"). The microcontroller and power circuitry 200 monitors junction temperature in the central processing unit die 212 via an on-die thermal monitor 220 and acts like a basic thermostat that is operating continuously to control the junction temperature in the central processing unit die 212 via the resistive heating element 204.

The on-die thermal monitor 220 converts an analog signal into a digital value and reports a temperature as a relative offset to zero representing the temperature of the central processing unit die 212. There are multiple on-die thermal sensors per central processing unit die. A Platform Environment Control Interface (PECI) monitors all of the on-die thermal sensors and reports the highest temperature. The digital value representing the highest temperature can be accessed via a Platform Environment Control Interface (PECI).

In an embodiment, the resistive heating element 204 is controlled using pulse width modulation. Through the use of pulse width modulation, power is cycled on and off to the resistive heating element 204 to create an average power to control the junction temperature. Heat is applied to the central processing unit die 212 to counter the Die Cooling Heatsink/Cup 214 filled with the liquid nitrogen or helium. The applied heat is reduced as the central processing unit die 212 initiates the boot process and begins generating heat and the power dissipation of the central processing unit die reaches a level to keep the junction temperature (Tj) in the central processing unit die 212 above the specified level. After the boot process is complete, the interposer 202 provides little or no heat to an overclocked central processing unit die 212. If workload of the central processing unit die 212 drops after the boot process is complete, for example, if the central processing unit is in an idle state waiting for a user prompt to start an application or benchmark, the junction die temperature may drop below the minimum junction temperature operating range and the interposer 202 may provide heat.

Figure 3:
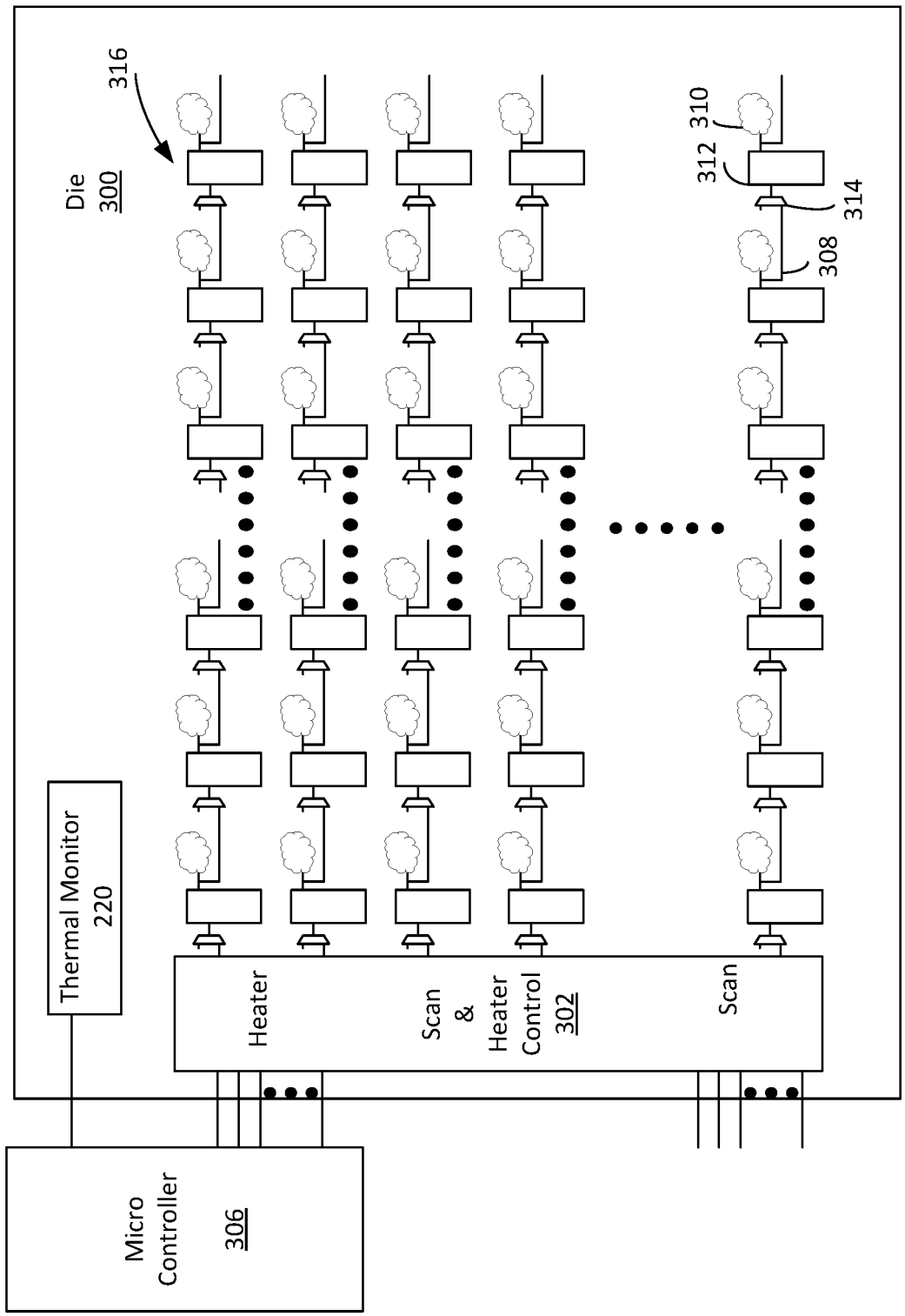
FIG. 3 is a block diagram of another embodiment of circuitry to apply and control heat to a die.

FIG. 3 is a block diagram of another embodiment of circuitry to apply and control heat to a die 300. A method used in high volume manufacturing to deliver test data from the input pins of a die to circuits in the die 300 and to observe the result of the test data at output pins of the die 300, is called scan-design. In scan-design, registers (flip-flops or latches) are connected in one or more scan chain(s) 316, which are used to gain access to internal nodes of the die 300. The scan chains 316 include a flip-flop scan-out 308, a logic cloud 310, a flip-flop 312 and a flip-flop scan-in multiplexor 314. Test patterns are shifted in via the scan chain(s) 316, functional clock signals are pulsed to test the circuits and the results of the test are shifted out to chip output pins and compared against the expected results.

As test patterns are shifted in to the scan chains 316, the scan chains 316 in the die 300 generate power dissipation caused by toggling nodes at high speed. The power dissipation results in heat that can be used to heat the die 300 prior to boot to provide supplemental die heat. The scan chains 316 in the die 300 are controlled by scan and heater control circuitry 302. The scan and heater control circuitry 302 includes a scan chain controller that is used to test the die 300 and a heater controller that generates the appropriate toggle rates of the die circuit nodes to generate the required heat. A microcontroller 306 coupled to the die 300 acts as a thermostat, using temperature read from an on-die thermal monitor 220 on the die 300. When the die starts operating, for example, performing pre-boot processes such as initializing phase lock loops in the die, the scan chains 316 in the die 300 can no longer be used to generate heat in the die 300.

Two embodiments to generate supplemental die heating have been described. In other embodiments, supplemental die heating can be provided by an on die resistor that creates power loss ($P=I^2R$; Power (P), Current (I), Resistance (R)) or by toggling gates in the die to create high clocking power.

In an embodiment the die is a System on chip (SoC) die. An SoC integrates all components of a computer including central processing unit, memory, graphics and input/output ports on a single circuit die. The SoC can include a die heating control unit that performs the functions of microcontroller 306. In another embodiment a chipset die, for example a Platform Controller Hub (PCH) can perform the functions of microcontroller 306. A chipset die includes circuitry to manage data flow between the central processing unit, memory and peripherals.

In yet another embodiment, microcontroller 306 can be a discrete controller, for example, a Complex Programmable Logic Device (CPLD). The control loop may require configurability with the central processing unit (via a CPU strap, also referred to as a CPU base clock frequency (BCLK))

and/or control (via pins) to work with an external micro-controller, Platform Controller Hub or Complex Programmable Logic Device.

Figure 4A:
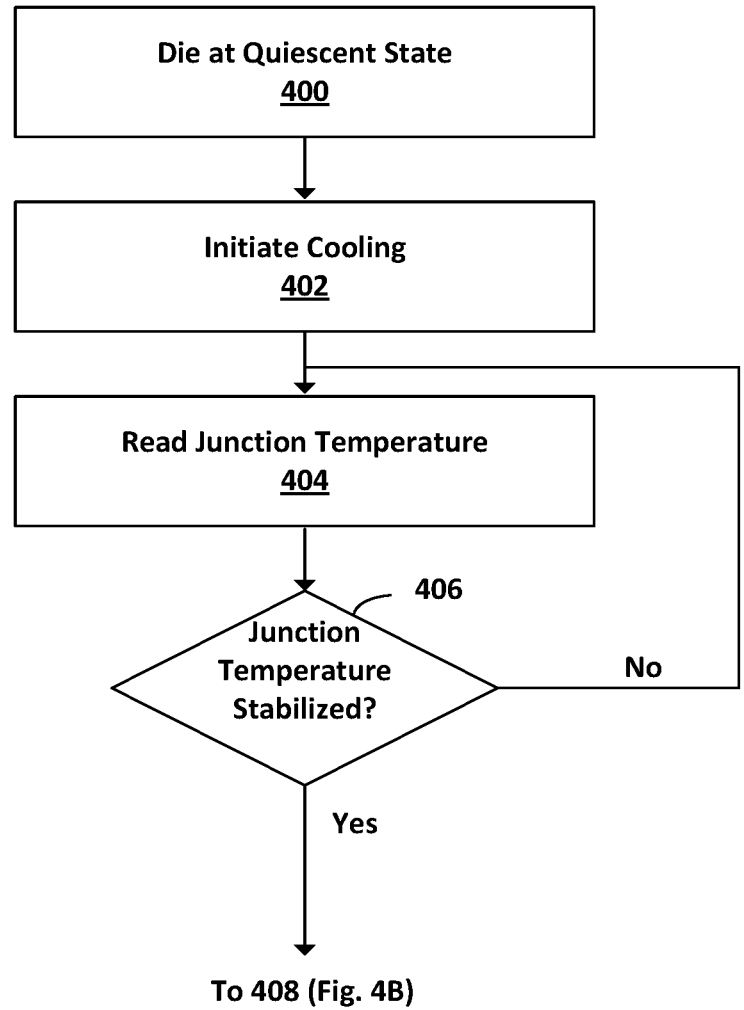
FIGS. 4A-4C is a flow graph illustrating a method implemented in the circuitry described in conjunction with FIGS. 2 and 3 to control the temperature of a die.
Figure 4B:
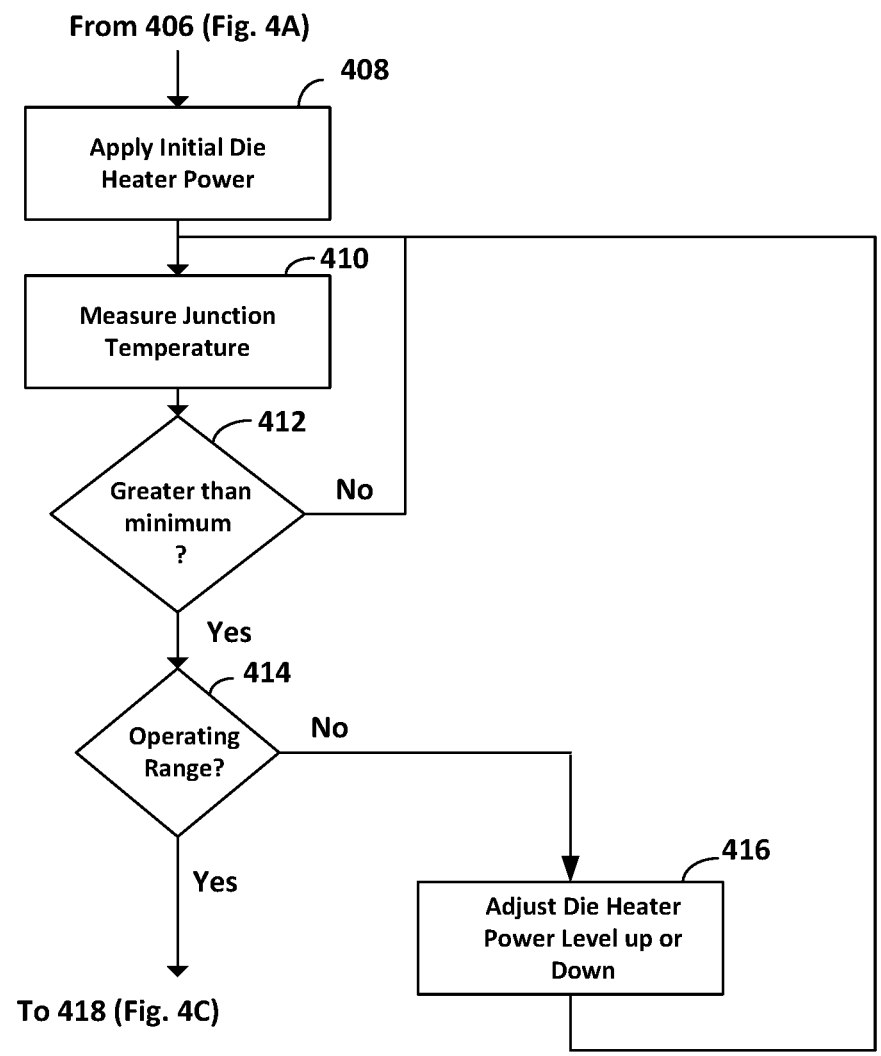
Figure 4C:
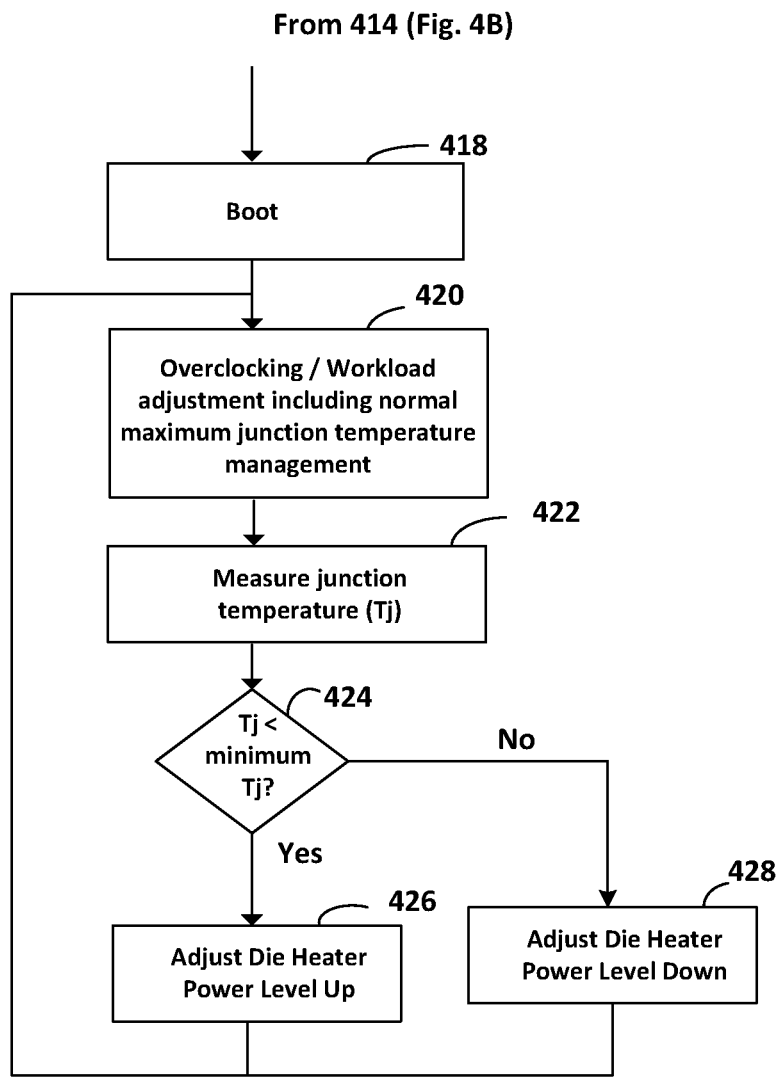

FIGS. 4A-4C is a flow graph illustrating a method implemented in the circuitry described in conjunction with FIGS. 2 and 3 to control the temperature of a die. FIGS. 4A-4C will be described in conjunction with the circuitry in FIG. 2.

FIG. 4A is a flowgraph illustrating a first phase of the method implemented in the circuitry described in conjunction with FIG. 2 to control the temperature of a die.

At block 400, the die is inactive in a quiescent state. Power is applied to temperature sensing circuitry in the die to warm the die.

At block 402, the die is cooled. As discussed earlier, the die can be cooled by applying liquid nitrogen or liquid helium to a reservoir on top of the die.

At block 404, after the liquid nitrogen or liquid helium is applied to an integrated circuit, the micro-controller reads the central processing unit die temperature via the Platform Environment Control Interface (PECI).

At block 406, if the junction temperature read from the die is stabilized, processing continues with block 408 (FIG. 4B). To determine if the temperature read from the die has stabilized, the temperature can be monitored over a period of time until the temperatures read are all within a percentage of each other (for example, 20 temperatures read are within 1% over a 5 second period). If the junction temperature has not stabilized, processing continues with block 404 to continue to monitor the junction temperature by reading the junction temperature from the register in the die.

FIG. 4B is a flowgraph illustrating a second phase of the method implemented in the circuitry described in conjunction with FIG. 2 to control the temperature of a die.

At block 408, the die temperature has stabilized. Initial Power is applied to the die to warm the die to a minimum junction temperature. The initial power applied is sufficient to raise the temperature to the operating range in a reasonable time, without creating thermal stress or exceeding the capabilities of the temperature control available power. The minimum junction temperature is typically provided by the manufacturer of the die in a datasheet.

At block 410, the micro-controller reads the junction temperature from a register in the die.

At block 412, if the junction temperature read from the die is greater than the maximum junction temperature, processing continues with block 414. If not, processing continues with block 410 to continue to monitor the junction temperature by reading the junction temperature from the register in the die.

At block 414, if the junction temperature of the die is within the operating temperature range, processing continues with block 418 (FIG. 4C). If not, processing continues with block 416.

At block 416, the junction temperature is not within the temperature range and the die heater power level is adjusted up or down to increase or decrease the junction temperature. Processing continues with block 410 to continue to monitor and adjust the die heater temperature until the junction temperature is within the operating temperature range, for example, −40 C to 100 C.

FIG. 4C is a flowgraph illustrating a third phase of the method implemented in the circuitry described in conjunction with FIG. 2 to control the temperature of a die At block 418, the junction temperature is within the operating temperature range. The boot process to load and initialize the system operating system is performed.

At block 420, after the operating system has been loaded, the die junction temperature is monitored to provide supplemental die heating. The supplemental die heating can continue to be provided for a period of time after boot starts. For example, the period of time can be dependent on the temperature at 104 (FIG. 1) within the operating temperature range 112 (FIG. 1) to provide a margin after the minimum temperature is reached at 102A (FIG. 1) before turning off the supplemental die heating, so that the die junction temperature does not drop below the minimum temperature at 102A before bootup and overclocking starts to generate heat.

At block 422, the micro-controller reads the junction temperature from a register in the die so that the micro-controller can maintain the junction temperature slightly above the minimum junction temperature in the operating temperature range. A low junction temperature is selected with some margin above the minimum operating temperature in the operating range to guard against failure if the workload power dissipation suddenly drops and the junction temperature falls. This margin is selected to allow sufficient time to increase or decrease the heat applied to die to maintain the junction temperature within the operating range.

At block 424, if the junction temperature is less than a minimum junction temperature, processing continues with block 426. If not, processing continues with block 428.

At block 426, the die heater power level is increased to increase the junction temperature. Processing continues with block 420 to continue to monitor and adjust the die heater temperature.

At block 428, the die heater power level is decreased to decrease the junction temperature. Processing continues with block 420 to continue to monitor and adjust the die heater temperature.

FIGS. 4A-4C have been described in conjunction with the circuitry in FIG. 2. The method shown in the flowgraph in FIGS. 4A-4C also applies to the circuitry in FIG. 3, with power applied at block 400 to the thermal monitor 304, scan-chain and scan and heater control circuitry 302 in the die and to the microcontroller 306.

Condensation often occurs in extreme cooled environments and can cause power and signal integrity issues. Temporary self-heating of a central processing unit die can be used to accelerate evaporation of moisture in an extreme low temperature environment. Temporary self-heating of a central processing unit die without overclocking can also be used in systems that are used in humid environments without overclocking to accelerate evaporation of moisture. For example, in automotive and industrial applications to address both humid and cold temperature environments or in other central processing unit/SOC platforms operation in extreme low temperature environments with less or no environmental infrastructure such as heated enclosures.

Figure 5:
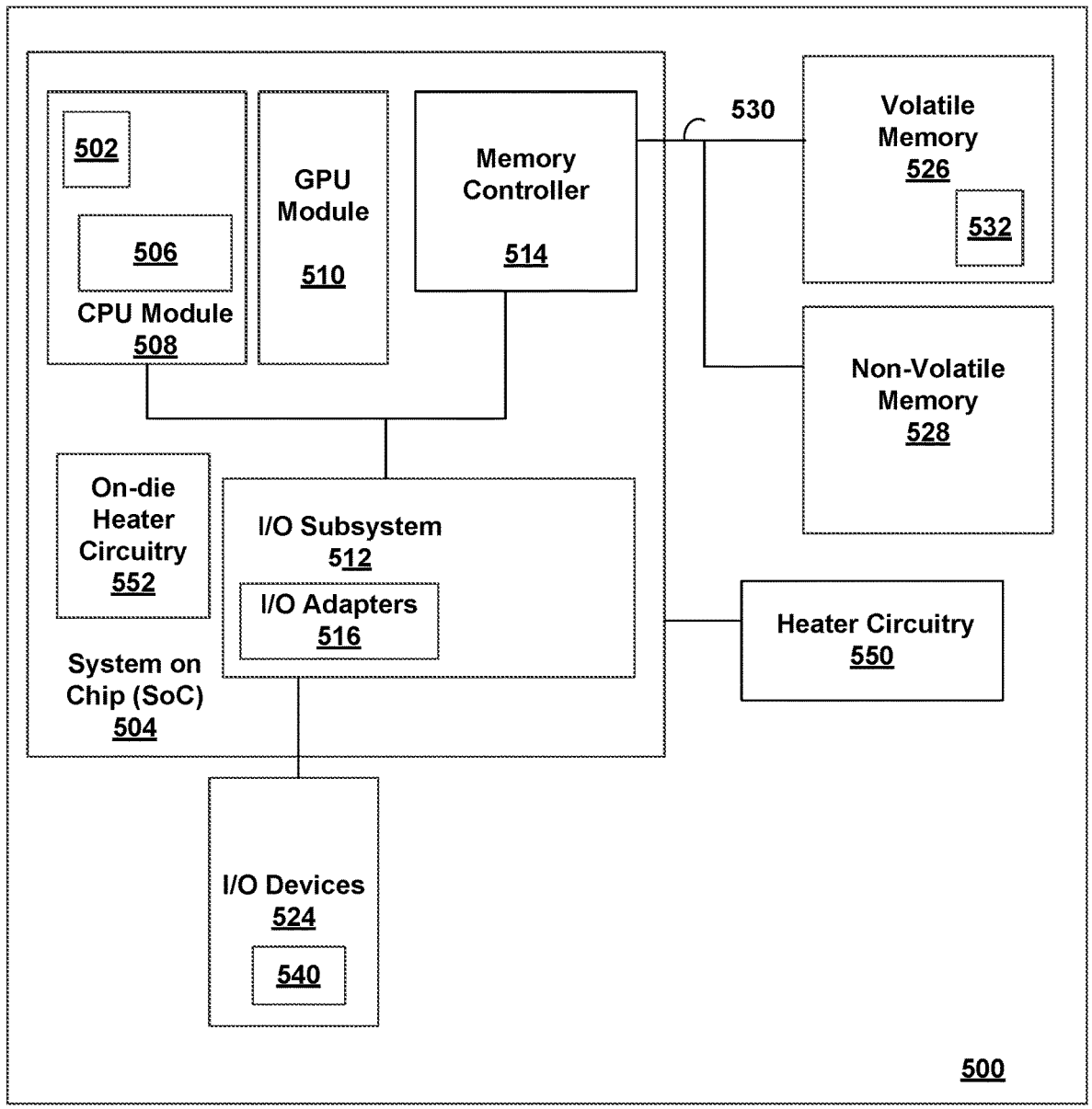
FIG. 5 is a block diagram of an embodiment of a computer system that includes circuitry to apply supplemental heat to a die in the computer system.

FIG. 5 is a block diagram of an embodiment of a computer system 500 that includes circuitry to apply supplemental heat to a die in the computer system 500. Computer system 500 can correspond to a computing device including, but not limited to, a server, a workstation computer, a desktop computer, a laptop computer, and/or a tablet computer.

The computer system 500 includes a die (system on chip (SOC or SoC) 504) which combines processor, graphics, memory, and Input/Output (I/O) control logic into one SoC package. The SoC 504 includes at least one Central Processing Unit (CPU) module 508, a memory controller 514, and a Graphics Processor Unit (GPU) 510.

The system can include circuitry to apply supplemental heat to a die as discussed in conjunction with FIGS. 2-4C.

The circuitry to apply supplemental heat to a die can be on-die heater circuitry 552 in the SoC 504 or heater circuitry 550 coupled to the SoC 504.

In other embodiments, the memory controller 514 can be external to the SoC 504. Although not shown, each of the processor core(s) 502 can internally include one or more instruction/data caches, execution units, prefetch buffers, instruction queues, branch address calculation units, instruction decoders, floating point units, retirement units, etc. The CPU module 508 can correspond to a single core or a multi-core general purpose processor, such as those provided by Intel® Corporation, according to one embodiment.

The Graphics Processor Unit (GPU) 510 can include one or more GPU cores and a GPU cache which can store graphics related data for the GPU core. The GPU core can internally include one or more execution units and one or more instruction and data caches. Additionally, the Graphics Processor Unit (GPU) 510 can contain other graphics logic units that are not shown in FIG. 5, such as one or more vertex processing units, rasterization units, media processing units, and codecs.

Within the I/O subsystem 512, one or more I/O adapter(s) 516 are present to translate a host communication protocol utilized within the processor core(s) 502 to a protocol compatible with particular I/O devices. Some of the protocols that adapters can be utilized for translation include Peripheral Component Interconnect (PCI)-Express (PCIe); Universal Serial Bus (USB); Serial Advanced Technology Attachment (SATA) and Institute of Electrical and Electronics Engineers (IEEE) 1594 "Firewire".

The I/O adapter(s) 516 can communicate with external I/O devices 524 which can include, for example, user interface device(s) including a display and/or a touch-screen display 540, printer, keypad, keyboard, communication logic, wired and/or wireless, storage device(s) including hard disk drives ("HDD"), solid-state drives ("SSD"), removable storage media, Digital Video Disk (DVD) drive, Compact Disk (CD) drive, Redundant Array of Independent Disks (RAID), tape drive or other storage device. The storage devices can be communicatively and/or physically coupled together through one or more buses using one or more of a variety of protocols including, but not limited to, SAS (Serial Attached SCSI (Small Computer System Interface)), PCIe (Peripheral Component Interconnect Express), NVMe (NVM Express) over PCIe (Peripheral Component Interconnect Express), and SATA (Serial ATA (Advanced Technology Attachment)).

The system 500 can include volatile memory 526 and/or non-volatile memory 628 communicatively coupled to the memory controller 514. A non-volatile memory (NVM) device is a memory whose state is determinate even if power is interrupted to the device. In one embodiment, the NVM device can comprise a block addressable memory device, such as NAND technologies, or more specifically, multi-threshold level NAND flash memory (for example, Single-Level Cell ("SLC"), Multi-Level Cell ("MLC"), Quad-Level Cell ("QLC"), Tri-Level Cell ("TLC"), or some other NAND). A NVM device can also include a byte-addressable write-in-place three dimensional crosspoint memory device, or other byte addressable write-in-place NVM devices (also referred to as persistent memory), such as single or multi-level Phase Change Memory (PCM) or phase change memory with a switch (PCMS), NVM devices that use chalcogenide phase change material (for example, chalcogenide glass), resistive memory including metal oxide base, oxygen vacancy base and Conductive Bridge Random Access Memory (CB-RAM), nanowire memory, ferroelectric random access memory (FeRAM, FRAM), magneto resistive random access memory (MRAM) that incorporates memristor technology, spin transfer torque (STT)-MRAM, a spintronic magnetic junction memory based device, a magnetic tunneling junction (MTJ) based device, a DW (Domain Wall) and SOT (Spin Orbit Transfer) based device, a thyristor based memory device, or a combination of any of the above, or other memory.

Volatile memory is memory whose state (and therefore the data stored in it) is indeterminate if power is interrupted to the device. Dynamic volatile memory requires refreshing the data stored in the device to maintain state. One example of dynamic volatile memory includes DRAM (Dynamic Random Access Memory), or some variant such as Synchronous DRAM (SDRAM). A memory subsystem as described herein can be compatible with a number of memory technologies, such as DDR3 (Double Data Rate version 3, original release by JEDEC (Joint Electronic Device Engineering Council) on Jun. 27, 2007). DDR4 (DDR version 4, initial specification published in September 2012 by JEDEC), DDR4E (DDR version 4), LPDDR3 (Low Power DDR version3, JESD209-3B, August 2013 by JEDEC), LPDDR4) LPDDR version 4, JESD209-4, originally published by JEDEC in August 2014), WIO2 (Wide Input/Output version 2, JESD229-2 originally published by JEDEC in August 2014, HBM (High Bandwidth Memory, JESD325, originally published by JEDEC in October 2013, DDR5 (DDR version 5, currently in discussion by JEDEC), LPDDR5 (currently in discussion by JEDEC), HBM2 (HBM version 2), currently in discussion by JEDEC, or others or combinations of memory technologies, and technologies based on derivatives or extensions of such specifications. The JEDEC standards are available at www.jedec.org.

An operating system 532 may be stored in the volatile memory 536. An operating system 542 is software that manages computer hardware and software including memory allocation and access to I/O devices. Examples of operating systems include Microsoft® Windows®, Linux®, iOS® and Android®.

Additionally, there can be one or more wireless protocol I/O adapters. Examples of wireless protocols, among others, are used in personal area networks, such as IEEE 802.15 and Bluetooth, 4.0; wireless local area networks, such as IEEE 802.11-based wireless protocols; and cellular protocols.

Flow diagrams as illustrated herein provide examples of sequences of various process actions. The flow diagrams can indicate operations to be executed by a software or firmware routine, as well as physical operations. In one embodiment, a flow diagram can illustrate the state of a finite state machine (FSM), which can be implemented in hardware and/or software. Although shown in a particular sequence or order, unless otherwise specified, the order of the actions can be modified. Thus, the illustrated embodiments should be understood as an example, and the process can be performed in a different order, and some actions can be performed in parallel. Additionally, one or more actions can be omitted in various embodiments; thus, not all actions are required in every embodiment. Other process flows are possible.

To the extent various operations or functions are described herein, they can be described or defined as software code, instructions, configuration, and/or data. The content can be directly executable ("object" or "executable" form), source code, or difference code ("delta" or "patch" code). The software content of the embodiments described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to the disclosed embodiments and implementations of the invention without departing from their scope. Therefore, the illustrations and examples herein should be construed in an illustrative, and not a restrictive sense. The scope of the invention should be measured solely by reference to the claims that follow.

What is claimed is:

1. An apparatus comprising:
    a die to operate in an overclocked mode; and
    circuitry to apply supplemental heat to the die while a die junction temperature is below an operating temperature range for the die junction temperature.

2. The apparatus of claim 1, wherein the supplemental heat is applied if the die junction temperature is below the operating temperature range for the die junction temperature after liquid nitrogen or liquid helium is applied to the die.

3. The apparatus of claim 2, wherein the supplemental heat is removed when the die junction temperature is within the operating temperature range for the die.

4. The apparatus of claim 1, wherein the circuitry is included in the die and the die is a System on Chip.

5. The apparatus of claim 1, wherein the circuitry includes a microcontroller communicatively coupled to the die.

6. The apparatus of claim 1, wherein the die is a central processing unit die and the circuitry is in a chipset die.

7. The apparatus of claim 1, wherein the circuitry is in a complex programmable logic device (CPLD).

* * * * *